United States Patent [19]
Hanamura et al.

[11] Patent Number: 5,699,224
[45] Date of Patent: Dec. 16, 1997

[54] THICK-FILM CAPACITOR AND CHIP-TYPE COMPOSITE ELECTRONIC COMPONENT UTILIZING THE SAME

[75] Inventors: Toshihiro Hanamura; Masanori Tanimura, both of Kyoto, Japan

[73] Assignee: Rohm Co., Ltd., Kyoto, Japan

[21] Appl. No.: 735,996

[22] Filed: Oct. 23, 1996

[30] Foreign Application Priority Data

Oct. 25, 1995 [JP] Japan .................. 7-278047
Nov. 22, 1995 [JP] Japan .................. 7-304874

[51] Int. Cl.$^6$ .................................. H01G 4/005
[52] U.S. Cl. .................. 361/313; 361/306.3; 361/303; 361/306.1; 361/308.1
[58] Field of Search .................. 361/275.3, 298.3, 361/301.3, 301.1, 303, 305, 306, 306.3, 311, 313, 321.2, 330, 308.1, 312; 333/172

[56] References Cited

U.S. PATENT DOCUMENTS 4,476,518 10/1984 Tsukahara .................. 361/328
4,561,039 12/1985 Tsukahara .................. 361/328
4,572,843 2/1986 Saito et al. .................. 427/555

FOREIGN PATENT DOCUMENTS 1315510 5/1973 United Kingdom.
1339071 11/1973 United Kingdom.

*Primary Examiner*—Leo P. Picard
*Assistant Examiner*—Anthony Dinkins
*Attorney, Agent, or Firm*—Nikaido, Marmelstein, Murray & Oram LLP

[57] ABSTRACT

Disclosed are a thick-film capacitor and a chip-type composite electronic component. A pair of end electrodes are formed on the insulator substrate. A lower electrode is formed on the insulator substrate. A dielectric layer is formed on the lower electrode. An upper electrode formed on the dielectric layer. One of the lower electrode and the upper electrode has a broad-width portion having a width wider than the remaining portion thereof. The one of the lower and upper electrode at the broad-width portion is directly connected to one of the end electrodes. The thick-film capacitor is provided with a capacitor electrode arranged to provide positive connection, even where the width of the capacitor electrode is determined narrow to meet a small capacitance value.

7 Claims, 3 Drawing Sheets

THICK-FILM CAPACITOR AND CHIP-TYPE COMPOSITE ELECTRONIC COMPONENT UTILIZING THE SAME

BACKGROUND OF THE INVENTION

This invention relates to thick-film capacitors having a dielectric layer sandwiched by metal layers overlaid on an insulator substrate, as well as chip-type composite electronic components utilizing a thick-film capacitor.

In chip-type composite electronic components, a thick-film capacitor is often combined with another electronic device such as a thick-film resistor. In such components, thick-film capacitors are conveniently formed through processes common to thick-film resistors. FIG. 6 illustrates a chip-type composite electronic component which has a capacitor and a resistor formed with thick-films, for example, on a single substrate chip.

As in the figure, a capacitor is provided on an insulator chip substrate 11, together with a resistor. End electrodes 12, 13 are provided oppositely at end portions of the substrate 11. The capacitor is formed by a lower electrode 14, a dielectric layer 15 overlaid on the lower electrode 14, and an upper electrode 16 formed on the dielectric layer 15 to electrically connect to the adjacent end electrode 13. The resistor, on the other hand, is formed by a resistance element 17 having opposite ends respectively connected to the end electrode 12 and the lower electrode 14 of the capacitor. Thus, the chip-type composite electronic component is provided by connecting the capacitor and the resistor in series between the end electrodes 12, 13 on one single substrate 11. The capacitor and the resistor are coated over by a passivation layer, not shown, of a glass or an epoxy resin for protection purposes, etc.

Meanwhile, the capacitance of the capacitor of this type is determined by the area, the dielectric constant, and the thickness of the dielectric layer 15 sandwiched between the upper electrode 16 and the lower electrode 14. To this end, the capacitance for the capacitor can be provided as desired by appropriately determining the width d of the upper electrode 16. It is therefore possible to provide various values as desired for the thick-film capacitor. Also, to adjust correctly variation in capacitance incurred through variation of processes during manufacture of thick-film capacitors, trimming with, e.g., laser beam is usually applied wherein an upper electrode or a dielectric layer once formed is partly removed by cutting in a groove form.

In practice, there is a demand for making capacitors with various values of capacitance for a certain size or a common process of thick-film capacitors. In such cases, when making a capacitor with relatively small capacitance, the width d of one electrode, e.g. the upper electrode 16, must be determined narrow relative to the width W of the dielectric layer 15. With such a narrow electrode, however, there is a disadvantage that the connection between the upper electrode 16 and the end electrode 13 becomes insufficient in terms of supply of electricity. Also, there is a possibility of disconnection in the upper electrode, due to the presence of steps between the dielectric layer 15 and the end electrode 13 on the flat surface of the substrate 11.

When the width of the upper electrode 16 is reduced narrow, there in turns is increase of exposed area in the dielectric layer 15 out of the upper electrode 16. On the other hand, the surface of the capacitor, together with the resistor, is covered with a passivation layer. However, the passivation layer has its end terminating on the surface of the end electrode 13. The presence of the interface between the passivation layer and the end electrode 13 will sometimes induce intrusion of external moisture. Particularly, during an electroplating process using an acid electroplating solution contained in a bath, such acid solution is apt to intrude through the interface between the passivation layer and the end electrode 13 upon experiencing external impact force or exposure to the solution, during the electroplating treatment. The solution once entered will at almost cases immediately reach the exposed portion of the dielectric layer 15. The intrusion of solution to the dielectric layer 15 causes change of dielectric characteristics such as capacitance or incurs chemical reaction of the dielectric material, e.g., by acid gradients of the electroplating solution, deteriorating the dielectric layer.

SUMMARY OF THE INVENTION

It is therefore an object of the present invention to provide a thick-film capacitor having a capacitor electrode arranged to provide positive connection even where the width of the capacitor electrode is determined narrow to meet a small capacitance value.

It is another object of the present invention to provide a thick-film capacitor structured dampproof, while having electrodes and a dielectric layer overlaid one another on an insulator substrate.

It is a further object of the present invention to provide a chip-type composite electronic component having a thick-film capacitor combined with another electronic element formed on a single substrate chip, which is structured of dampproof with electrode positive connection.

In accordance with a first aspect of the present invention, there is provided a thick-film capacitor comprising: an insulator substrate; a pair of end electrodes formed on the insulator substrate; a lower electrode formed on the insulator substrate; a dielectric layer formed on the lower electrode; an upper electrode formed on the dielectric layer; and wherein one of the lower electrode and the upper electrode has a broad-width portion having a width wider than the remaining portion thereof, the one of the lower and upper electrode at the broad-width portion being directly connected to one of the end electrodes. With such structure, even where the width of the capacitor electrode is made narrow, a broad width of connection is provided between the capacitor electrode and the end electrode for external electrical connection, offering positive connection without incurring electrical disconnection.

Preferably, the broad-width portion extends up to the dielectric layer. By doing so, a broad width of connection is obtained at a stepped portion present between the dielectric layer and the adjacent end electrode on the surface of the insulator substrate.

In accordance with a second aspect of the present invention, there is also provided a thick-film capacitor comprising: one of the lower electrode and the upper electrode is directly connected to one of the end electrode, the one of the lower and upper electrode having a portion wider in width than the dielectric layer, the wider portion extending at least between the one of end electrodes and the dielectric layer. With such structure, the end portion of the dielectric layer adjacent the end electrode is completely covered by the capacitor electrode. Consequently, even where moisture enters through the interface between a passivation layer and the end electrode, the moisture is blocked by the capacitor electrode as a breakwater, being prevented from directly reaching the dielectric layer. Therefore, there is almost no fear of incurring chemical reaction and the resulting deterioration in the dielectric layer, thus ensuring stability and reliability for capacitor characteristics.

Preferably, the one of the lower and upper electrodes has the wider portion at a position of at least between the one of end electrodes and the dielectric layer, and a narrower portion at a position close to the other of the lower and upper electrodes. By doing so, the connection of capacitor electrode to the end electrode is positively made in a manner preventing against intrusion of moisture to the dielectric layer, while keeping the characteristic, i.e., the capacitance for a capacitor at a required value.

In accordance with a third aspect of the present invention, there is provided a chip-type composite electronic component comprising: an insulator substrate; a pair of end electrodes formed on the insulator substrate; a lower electrode formed on the insulator substrate; a dielectric layer formed on the lower electrode; an upper electrode formed on the dielectric layer; a thick-film capacitor formed by the lower and upper electrodes and the dielectric layer; an electronic device formed in connection with the thick-film capacitor; wherein the thick-film capacitor and the electronic device are connected between the end electrodes; and wherein one of the lower electrode and the upper electrode is directly connected to one of the end electrode, the one of the lower and upper electrode having a portion wider in width than the dielectric layer, the wider portion extending at least between the one of end electrodes and the dielectric layer. With such structure, the chip-type composite electronic component provided is sufficiently downsized but electrically or chemically reliable.

Preferably, the electronic device is a resistor having a resistance element having a trimming groove formed therein for adjustment on resistance value thereof, the resistance element being placed deviated toward one longer side of the insulator substrate, and the trimming groove extending from opposite side of the resistance element to the longer side of the substrate. By doing so, the chip-type composite electronic component is sufficiently downsized by efficient layout for electronic devices on the single substrate chip. The trimming groove formed in the resistance element is positively prevented against entering of moisture therethrough.

For a fuller understanding of the nature and advantages of the invention, reference should be made to the ensuing preferred embodiment taken in conjunction with the accompanying drawings.

PREFERRED EMBODIMENT OF THE INVENTION

Figure 1:
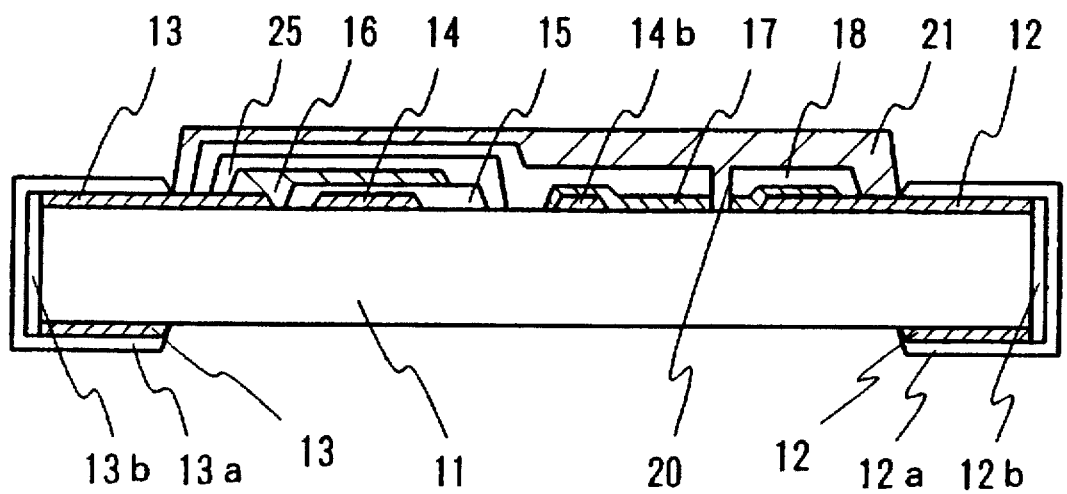
FIG. 1 is a longitudinal sectional view of a chip-type composite electronic component having a thin-film capacitor according to one embodiment of the present invention.

First referring to FIG. 1, there is illustrated a sectional view of a chip-type composite electronic component utilizing a thick-film capacitor according to the present invention. The chip-type composite component has a resistor and a capacitor provided in series between opposite end electrodes 12, 13 formed on both ends of an insulator substrate 11.

The capacitor comprises a lower electrode 14 formed on the insulator substrate 11, a dielectric layer 15 formed over the lower electrode 14, and an upper electrode 16 formed overlying the dielectric layer 15. The dielectric layer 15 is made up of a lead-based relaxer. The upper electrode 16 is formed continuous with or connected to the other end electrode 13. The capacitor thus constructed is covered with a first glass layer 25 formed of a dielectric glass. The resistor, on the other hand, is formed by a resistance element 17 which is formed of, e.g., ruthenium oxide. The resistance element 17 has one end electrically connected with one end electrode 12 and the other end electrically connected with an intermediate electrode 14b continuous with a lower electrode 14 for the capacitor.

The resistance element 17 has a trimming groove 20 for adjusting the resistance thereof to a desired value. The resistance element, together with the capacitor, is covered by a second glass layer 18 to prevent electrode portions from being contaminated upon carrying out trimming on the resistance element 17. The second glass layer 18 is further covered by an passivation layer 21 formed, e.g., of an epoxy resin, to protect as an overcoat the capacitor and resistor including the trimming groove 20.

The end electrodes 12, 13 respectively extend to the backside of the insulator substrate 11 through side-electrode portions 12b, 13b. These side-electrode portions 12b, 13b are formed by printing a conductor paste on opposite side surface of the insulator substrate 11. The end electrodes 12, 13 are respectively coated with plating layers 12a, 13a. The plating layer 12a, 13a is multi-layered by an Ni-plating layer and a solder-plating layer so that a complete component can be directly soldered on a mother printed circuit board.

Figure 3:
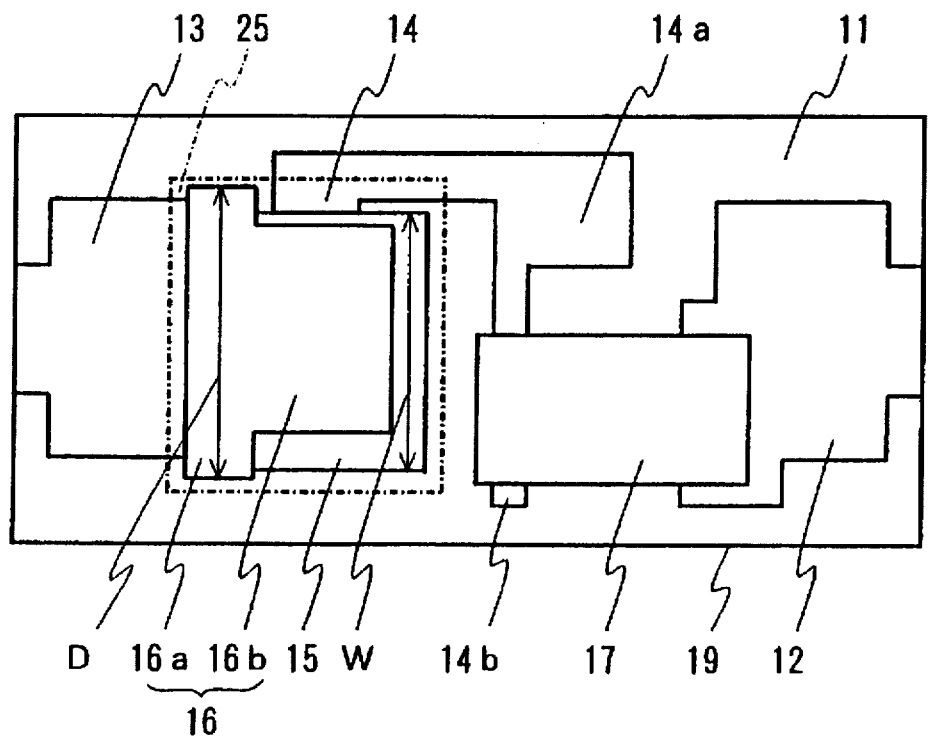
FIG. 3 is a plan view similar to FIG. 2, showing a process of forming a resistor after formation of a capacitor.

The upper electrode 16 of the capacitor, as shown in a FIG. 3, has a broad-width portion 16a and a narrow-width portion 16b formed continuous with the broad-width portion. The broad-width portion 16a is connected with the end electrode 13, whereas the narrow-width portion 16b overlies the lower electrode 14. The broad-width portion 16a has a width D which is wider than a width W of the dielectric layer 15. The broad-width portion 16a covers an end portion of the dielectric layer 15 close to the end electrode 13, and extends to overlie the part of the end electrode 13. The narrow-width portion 16b, on the other hand, is determined of its width such that a desired capacitance value is provided by the area in the dielectric layer 15 which is sandwiched between the upper-electrode narrow-width portion 16b and the lower electrode 14 opposed thereto. The capacitance of the capacitor generally determined by such factors as the capacitance area, the dielectric layer thickness, and the material of the dielectric layer 15. To this end, the narrow-width portion 16b of the upper electrode 16 can be determined so as to meet the capacitance required for a capacitor to be formed, in consideration of dielectric characteristics, layer thickness, etc. of a dielectric layer 15 to be formed. In other words, the capacitance of a capacitor is controlled by determining the width of the narrow-width portion 16b, provided that other factors are fixed constant. In practice, the capacitance is conveniently varied by controlling the width of the upper electrode, thereby providing various classes of capacitors with desired capacitance values. In such cases, the width of the narrow-width portion 16b decreases as the capacitance required for the capacitor decreases smaller.

Meanwhile, with the above-stated structure, the electronic component is prevented against entering of moisture, while ensuring electrical connection between the upper electrode 16 and the end electrode 13. This is because the end portion of the dielectric layer 15 close to the end electrode 13 is completely covered by the broad-width portion 16a of the upper electrode 16. Further, the broad-width portion 16a of the upper electrode 16 is directly overlaid on the end electrode 13 in an overlapped manner. The end electrode 13 and the upper electrode 16, formed by respective metallic materials, provides sufficient adhesion in the interface therebetween. Further, the spacing or gap involving steps between the end electrode 13 and the dielectric layer 15 is completely filled with the material of the broad-width portion 16a, or the upper electrode 16. With such structure, if external moisture should invade through the interface between the end electrode 13 and the passivation layer 21, it will be blocked by the broad-width portion 16a of the upper electrode 16 without reaching the dielectric layer 15. On the contrary, in the conventional structure, no broad-width portion is provided in the upper electrode and accordingly the dielectric layer has exposed portions close to the end electrode. Accordingly, when external moisture enters through between the end electrode and the passivation layer, the moisture intrudes further to the dielectric layer, possibly incurring deterioration in the dielectric layer. However, in the present invention, the presence of the broad-width portion 16a serves to block against the entrance of external moisture to the dielectric layer 15.

The broad-width portion 16a of the upper electrode 16 also provides a sufficient area of electrical connections with the end electrode 13. That is, where the upper electrode 16 must be narrowed in width to meet a desired capacitance value, the broad-width portion 16a provides a sufficient connecting area between the upper electrode 16 and the end electrode 13, preventing against failure of connection and offering reliability in electrical connection. Further, the gaps involving steps between the end electrode 13 and the dielectric layer 15 is filled by the material of the broad-width portion 16a, there is less possibility of occurrence of disconnection on the steps by the end electrode 13 and the upper electrode 16, ensuring reliability in electrical connection therebetween.

Incidentally, it is impossible to form a dielectric layer directly on an end electrode. This is because if a dielectric material containing palladium is applied onto the end electrode, there encounters a fear of taking place of chemical reaction between the end electrode 13 and the dielectric layer 15, inducing corrosion on the electrode material or causing variation in dielectric characteristics for the capacitor. As a consequence, the dielectric layer 15 is provided in a spaced relation from the end electrode 15. To this end, step configuration is inevitably introduced between the end electrode 13 and the dielectric layer 15.

The capacitance of a capacitor is determined depending on the area opposed between the lower electrode 14 and the upper electrode 16. Accordingly, if a broad-width portion 16a is provided at a position where it does not oppose to or overlap with the lower electrode 14, the resulting capacitance is not affected by such provision of the broad-width portion 16a, as long as the upper electrode 16 has a narrow-width portion opposing to or overlapping with the lower electrode 14 in a width determined for a desired capacitance value. Therefore, the narrow-width portion 16b is provided at such a position that the upper electrode 16 serves as a capacitor electrode. With such arrangement, it is possible to provide electrical connection of the upper electrode 16 to the end electrode 13 without exerting influences on electric characteristic for the capacitor. Also, the dielectric layer 15 is completely covered at its end portion by the upper electrode 16 to prevent against entrance of moisture.

Figure 5:
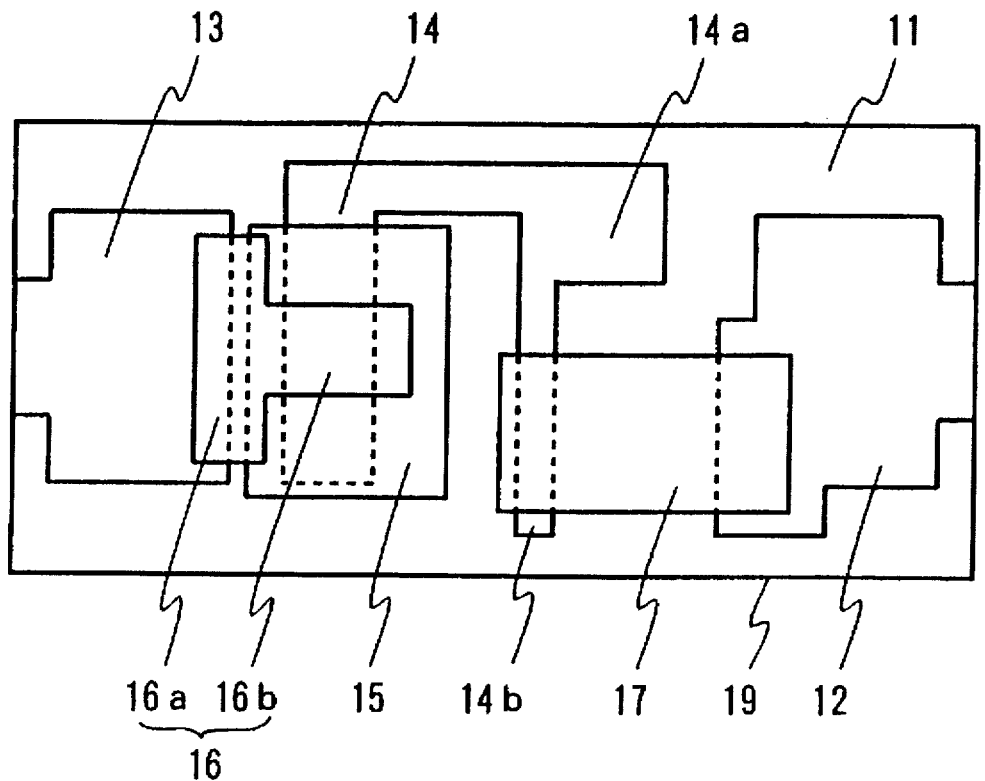
FIG. 5 is a plan view of a composite electronic component having a thick-film capacitor according to another example.
Figure 6:
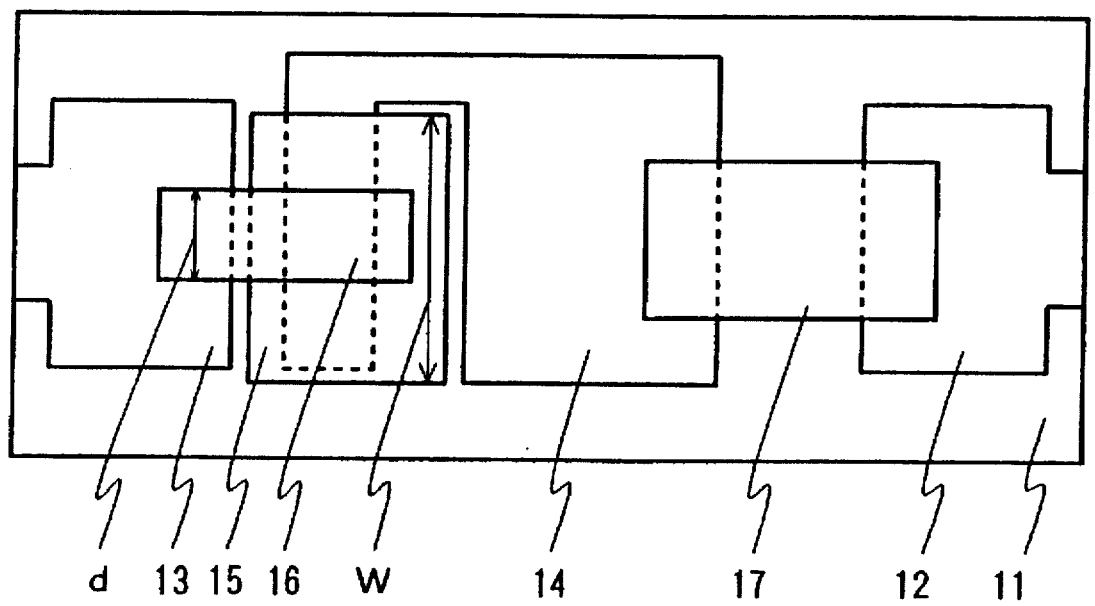
FIG. 6 is a plan view of a composite electronic component having a thick-film capacitor, useful for explaining the relation in width of an electrode and a dielectric layer of the capacitor.

In the above embodiment the broad-width potion is formed in the upper electrode. Alternatively, it is also possible to provide a broad-width portion in the lower electrode instead of the upper electrode. Where electrical connection is made between the end electrode and the lower electrode, a broad width portion with a width wider than the dielectric layer may be provided in the lower electrode. Also, where there is no problem of entrance of moisture, the broad-width portion may be provided narrower than the width of the dielectric layer as shown in FIG. 5. In such cases, the provision of the broad-width portion, having increased width relative to a narrow-width portion, is still effective for improving the reliability of electrical connection.

Figure 4:
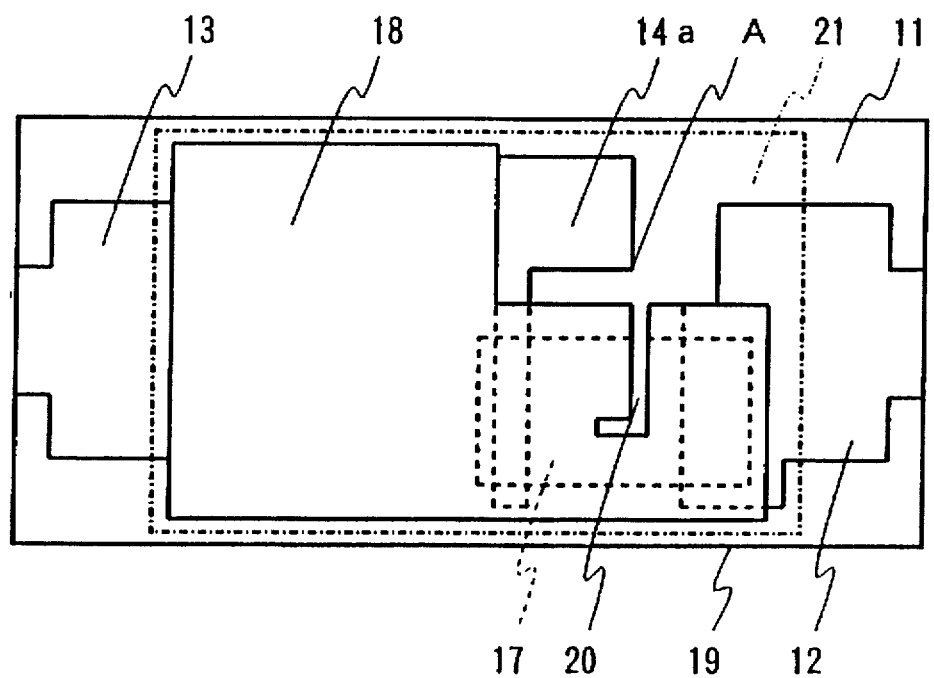
FIG. 4 is a plan view similar to FIG. 3, showing a process of forming a trimming groove relative in position to other elements for the composite component.

Referring to FIG. 4, there is illustrated a chip-type composite electronic component involving a trimming groove in the resistor thereof. The resistance of a resistor can be adjusted by forming a trimming groove 20. To form a trimming groove 20, a laser beam is irradiated onto the resistance element 17 such that the groove extends starting from an inner side of the resistance element 17 in a direction transversing the resistance element 17 and then bent toward a direction perpendicular thereto. In laser trimming, the resistance element 17 is partly removed to thereby increase the resistance thereacross. The transverse portion of the trimming groove 20 serves to largely increase the resistance value, thus being utilized for rough adjustment. On the other hand, the longitudinal portion less contributes for increase of the resistance. In this embodiment, the resistance element 17 is placed deviated toward one side 19 of the substrate 11 for realizing efficient layout of an electrode pad 14a used for measurement of the resistance. That is, the trimming groove 20 is formed from the inner side of the resistance element 17 with reference to the adjacent corner of the electrode pad 14a as a reference point, while measuring the resistance across the resistance element 17, i.e., between the electrode pad 14a and the end electrode 12.

With such structure, the distance between the one side 19 of the substrate 11 and the adjacent side of the resistance element 17 is short, for example, approximately 0.25 mm. Consequently, where a trimming groove is formed from the side 19 of the substrate 11 and thereafter a passivation layer 21 is formed through screen printing, there is a high possibility of exposure of the trimming groove 20 out of the passivation layer 21 due to misalignment of print masking for the passivation layer. Such exposure of the trimming groove 20 will induce intrusion of an electroplating solution therethrough, possibly incurring change of resistance once adjusted or corrosion such as in electrode portions. In the present invention, however, the trimming groove 20 is formed from the inner side of the resistance element 17, preventing against the problem stated above. Thus, there is almost no fear of change of resistance value or corrosion in the electrodes due to intrusion of moisture.

Figure 2:
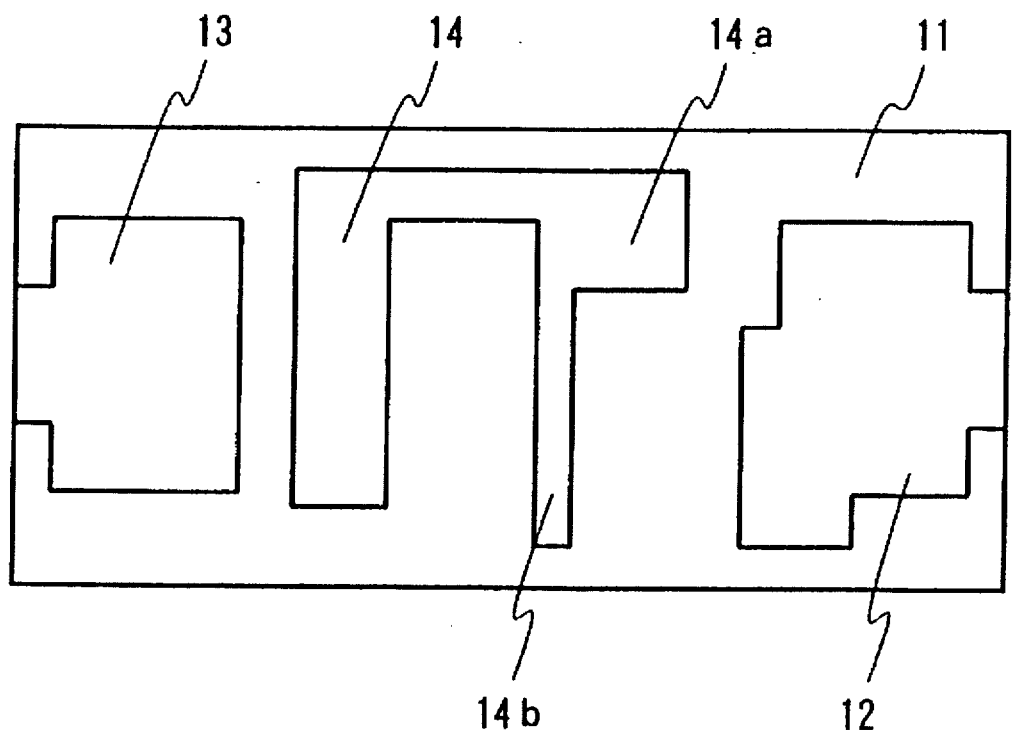
FIG. 2 is a plan view of the composite electronic component of FIG. 1, showing a process of forming electrode portions on an insulator substrate.

Then, a method of manufacturing a chip-type electronic component is explained by referring to FIGS. 2 to 4.

Referring to FIG. 2, a conductor paste containing silver and palladium is printed in a given pattern on the top and bottom surfaces of an insulator substrate 11. Incidentally, although the substrate 11 is practically in a large-sized undivided form, it will be explained as a divided single form hereinbelow for simplifying explanations. The printed conductor paste is baked to be formed into electrode portions, i.e., end electrodes 12, 13, and a lower electrode 14 having an electrode pad 14a and an intermediate electrode 14b continuous therewith. Thereafter, a dielectric paste containing a lead-base relaxer is printed and then baked to be formed into a dielectric layer 15, as shown in FIG. 3. Then, an upper electrode 16 is formed by printing a conductor paste containing silver and platinum in a manner bridging between the dielectric layer 15 and the end electrode 13. The printing of the conductor paste is made through masking such that an upper electrode 16 to be formed has a narrow-width portion 16b over the lower electrode 14 and a broad-width portion 16a. The width of the narrow-width portion 14b is determined so as to provide a desired capacitance value for a capacitor, whereas the broad-width portion 16a has a width D, which is greater than that of the narrow-width portion 16b, for connection to the end electrode 13. With such configuration, the dielectric layer 15 is completely covered at its end portion by the broad-width portion 16a. The printed conductor paste is then baked to be formed into an upper electrode 16, thereby providing a capacitor. Thereafter, a first glass layer 25 of a dielectric glass is coated by printing and baking to cover the capacitor.

Then, a resistance paste containing ruthenium oxide is printed so as to bridge between the end electrode 12 and the intermediate electrode 14b, and then baked to be formed into a resistance element 17. The resistance element 17 has, for example, a size with a length of 0.85 mm by a width of 0.5 mm and a layer thickness of 10 μm.

Referring to FIG. 4, a second glass layer 18 is formed of a crystallized glass such as a alumina-silicate glass to cover the first glass layer 25 and the resistance element 17 with the electrode pad 14a exposed therefrom. Incidentally, the order of formation may be reversed for the dielectric layer 15 and the resistance element 17. Then, the substrate 11 is transported into a trimming apparatus. The substrate 11 is positioned in place such that a corner A of the electrode pad 14a can be acknowledged by a camera. Measuring probes are contacted with the respective end electrode 12 and the electrode pad 14a to permit measurement of the resistance value for the resistance element 17. With such a state, a laser beam being irradiated is moved from a side of the resistance element 17 close to the corner A toward transversing the resistance element 17 for rough adjustment, while measuring the resistance value. Once the resistance value approaches to a specified value, the movement of the laser beam is changed of direction rectangularly for fine adjustment. The laser trimming is completed when the specified resistance value is reached.

As stated above, the starting point for laser trimming is determined by acknowledging the corner A as a reference point. In this case, the corner A is readily acknowledged by the contrast between the electrode pad 14a and the substrate 11. By doing so, the trimming groove 20 can be formed from the side opposite to the side 19 of the substrate. Therefore, there is almost no possibility of invasion of moisture through the trimming groove 20.

Thereafter, an overcoat layer 21 is formed by printing and subsequent curing an epoxy resin, so as to protect the entire portion except for the end electrodes 12, 13. Although the various portions as stated above are formed in a matrix form on a large-sized undivided substrate 11, not shown, the undivided substrate 11 after being formed with passivation layers 21 are broken between the end electrodes 12, 13 into bar-formed substrates, not shown. The bar substrate is applied with a conductor paste containing silver so as to bridge between the associated ones of the end electrodes 12, 13 on the top and bottom surfaces of the bar substrate 11. The conductor paste applied is then cured to be formed into side portions 12b, 13b of the end electrodes 12, 13. Thereafter, the bar substrates 11 is further broken into individual substrate chip 11. These substrates 11 are subjected to electroplating to have plating layers of nickel and solder on the end electrodes 12, 13, thereby providing chip-type composite electronic components, as shown in FIG. 1.

Although in the above embodiment trimming was performed for the resistor, it may also be made on the capacitor by forming a trimming groove, e.g., in the upper electrode so as to adjust the capacitance of the capacitor. Also, electronic elements to be formed for a composite component are not limited to a capacitor and a resistor. It is possible to form a capacitor in a single form or in combination with other electronic elements such as an inductor.

What is claimed is:

1. A thick-film capacitor comprising:

an insulator substrate;

a pair of end electrodes formed on said insulator substrate;

a lower electrode formed on said insulator substrate;

a dielectric layer formed on said lower electrode;

an upper electrode formed on said dielectric layer; and wherein one of said lower electrode and said upper electrode has a broad-width portion having a width wider than the remaining portion thereof, said one of said lower and upper electrode at said broad-width portion being directly connected to one of said end electrodes.

2. The thick-film capacitor of claim 1, wherein said broad-width portion extends up to said dielectric layer.

3. A thick-film capacitor comprising:

an insulator substrate;

a pair of end electrodes formed on said insulator substrate;

a lower electrode formed on said insulator substrate;

a dielectric layer formed on said lower electrode;

an upper electrode formed on said dielectric layer; and wherein one of said lower electrode and said upper electrode is directly connected to one of said end electrode, said one of said lower and upper electrode having a portion wider in width than said dielectric layer, said wider portion extending at least between said one of end electrodes and said dielectric layer.

4. A thick-film capacitor of claim 3, wherein said one of said lower and upper electrodes has said wider portion at a position of at least between said one of end electrodes and said dielectric layer, and a narrower portion at a position close to the other of said lower and upper electrodes.

5. A chip-type composite electronic component comprising:

an insulator substrate;

a pair of end electrodes formed on said insulator substrate;

a lower electrode formed on said insulator substrate;

a dielectric layer formed on said lower electrode;

an upper electrode formed on said dielectric layer;

a thick-film capacitor formed by said lower and upper electrodes and said dielectric layer;

an electronic device formed in connection with said thick-film capacitor;

wherein said thick-film capacitor and said electronic device are connected between said end electrodes; and wherein one of said lower electrode and said upper electrode is directly connected to one of said end electrode, said one of said lower and upper electrode having a portion wider in width than said dielectric layer, said wider portion extending at least between said one of end electrodes and said dielectric layer.

6. The chip-type composite electronic component of claim 5, wherein said electronic device is a resistor having a resistance element having a trimming groove formed therein for adjustment on resistance value thereof, said resistance element being placed deviated toward one longer side of said insulator substrate, and said trimming groove extending from opposite side of said resistance element to said one longer side of said substrate.

7. The chip-type composite electronic component of claim 6, wherein said trimming groove extends in a direction transversing said resistance element to have a tip end thereof extending in a direction parallel to said resistance element.

* * * * *